United States Patent [19]

Ninomiya

[11] Patent Number: 5,287,286
[45] Date of Patent: Feb. 15, 1994

[54] LOW-BATTERY STATE DETECTING SYSTEM AND METHOD FOR DETECTING THE RESIDUAL CAPACITY OF A BATTERY FROM THE VARIATION IN BATTERY VOLTAGE

[75] Inventor: Ryozi Ninomiya, Oome, Japan
[73] Assignee: Kabushiki Kaisha Toshiba, Kawasaki, Japan
[21] Appl. No.: 73,987
[22] Filed: Jun. 8, 1993

Related U.S. Application Data

[63] Continuation of Ser. No. 951,338, Sep. 25, 1992, abandoned, which is a continuation of Ser. No. 545,542, Jun. 29, 1990, abandoned.

[30] Foreign Application Priority Data

Jul. 31, 1989 [JP] Japan .................. 1-198362

[51] Int. Cl.⁵ .................. G01R 19/165; G06F 15/20
[52] U.S. Cl. .................. 364/481; 320/48; 364/483
[58] Field of Search .................. 340/636; 320/48; 364/481, 483

[56] References Cited

U.S. PATENT DOCUMENTS

| | | | |
|---|---|---|---|
| 3,979,657 | 9/1976 | Yorksie ............... | 320/13 |
| 4,193,025 | 2/1980 | Frailing et al. ....... | 324/427 |
| 4,445,090 | 4/1984 | Melocik et al. ....... | 320/48 X |
| 4,488,115 | 12/1984 | Padhrasky ............ | 340/636 X |
| 4,562,548 | 12/1985 | Andersen et al. ...... | 364/483 |
| 4,571,690 | 2/1986 | Munetsugu ............ | 364/483 |
| 4,660,027 | 4/1987 | Davis ................ | 340/636 |
| 4,678,998 | 7/1987 | Muramatsu ............ | 324/427 |
| 4,827,220 | 5/1989 | Figh ................. | 324/426 |
| 4,849,700 | 7/1989 | Morioka et al. ....... | 324/427 |
| 4,907,183 | 3/1990 | Tanaka ............... | 364/707 |
| 4,984,185 | 1/1991 | Saito ................ | 364/707 |
| 5,185,566 | 2/1993 | Goedken et al. ....... | 320/48 |

FOREIGN PATENT DOCUMENTS

225106 6/1987 European Pat. Off. .
2121971 1/1984 United Kingdom .

Primary Examiner—Edward R. Cosimano
Attorney, Agent, or Firm—Cushman, Darby & Cushman

[57] ABSTRACT

There is provided a low-battery detection reference voltage table for memorizing the correspondence between current values and low-battery detection reference voltage values, which is obtained from battery voltage characteristic curves corresponding to different current values. Further, there is provided a low-battery reference voltage correction table for correcting the low-battery detection reference voltage in accordance with a voltage variation. Referring to the low-battery detection reference voltage table on the basis of the value of current output from the battery, the low-battery detection reference voltage corresponding to the current value is obtained. The voltage variation is found from the currently measured battery voltage and the previously measured battery voltage which is memorized. On the basis of the voltage variation, the correction voltage is found with reference to the low-battery reference voltage correction table. The found correction voltage is added to the low-battery reference voltage, thereby correcting the low-battery reference voltage. When the measured battery voltage is lower than the corrected low-battery detection reference voltage, the low-battery stated is determined.

8 Claims, 5 Drawing Sheets

| TIME REQUIRED FOR POWER SUPPLY VOLTAGE BEING DECREASED BY 59 mV | 4 SEC OR LESS | 4-8 SEC | 8-12 SEC | ---- | 32 SEC OR MORE |
|---|---|---|---|---|---|
| CORRECTION VALUE FOR REFERENCE VOLTAGE | +177mV | +177mV | +118mV | | +0V |

LOW-BATTERY STATE DETECTING SYSTEM AND METHOD FOR DETECTING THE RESIDUAL CAPACITY OF A BATTERY FROM THE VARIATION IN BATTERY VOLTAGE

This is a continuation of application Ser. No. 07/951,338, filed on Sep. 25, 1992, now abandoned, which is a continuation of application Ser. No. 07/545,542, filed on Jun. 29, 1990, now abandoned.

BACKGROUND OF THE INVENTION

1. Field of the Invention

The present invention relates to a low-battery state detecting system and method for suitable use in a personal computer using a battery as a power source.

2. Description of the Related Art

There is known a personal computer using a battery as a power source and including a power controller capable of monitoring the residual capacity of the battery. The power controller normally includes a 1-chip microcomputer and performs data communication with a host CPU through a serial line, thereby supplying necessary power.

In the prior art, the state ("low-battery state"), wherein the residual capacity of the battery so decreases that it may be difficult to normally operate the personal computer, is detected when the current output from the battery and the battery voltage are monitored and found to fail in a predetermined condition.

The method of detecting the low-battery state will now be described in detail with reference to FIG. 1 or a graph showing battery characteristics. FIG. 1 illustrates how the battery voltage varies with the lapse of time. The ordinate indicates battery voltage, and the abscissa indicates time. In FIG. 1, three curves I, II and III represent the variations of battery voltages when electric currents of 200 mA, 400 mA and 600 mA are output from the battery. As is obvious from FIG. 1, the greater the output current from the battery, the sooner the battery voltage lowers.

Point A on the ordinate represents the minimum voltage for normal operation of the personal computer. Point C on the abscissa represents the time when the battery voltage lowers to point A in the case where the current is 600 mA. Point B on the abscissa represents a reference point for determining whether the battery is in the low-battery state. When the maximum value of the electric current output from the battery is 600 mA, the normal operation of the personal computer is ensured at least in the time period of points C–B after the low-battery state is determined.

In the prior art, the current output from the battery and the battery voltage are monitored, and when the battery voltage reaches point B (B'-I, B'-II, B'-III), the low-battery state is determined. In the battery-powered personal computer, the longer the time of the battery-powered operation, the more desirable the computer. For this purpose, it is an essential factor to exactly detect the low-battery state. This enables the battery to be used up to a maximum capacity, thereby lengthening the time of the battery-powered operation. In a conventional technique, the low-battery state cannot be detected precisely, because of battery variations. This problem will now be explained with reference to FIG. 2 of a graph of battery characteristics.

FIG. 2 shows variations in battery voltages when the battery is charged in different charge time periods. Point A on the ordinate represents the minimum voltage for normal operation of the personal computer. Point B' on the abscissa represents a reference point for determining whether or not the battery is in the low-battery state. The time period (Cn–Bn, n=1, 2, 3, 4) between the determination of the low-battery state and the failure of the normal operation of the personal computer, increases with as the charge time of the battery. Thus, in the conventional technique, the battery remains sufficient for normal operation of the personal computer, in some cases, despite the fact that the low-battery state has been determined. However, the battery cannot be used efficiently.

SUMMARY OF THE INVENTION

The object of the present invention is to provide a low-battery detection system and a low-battery detection method, wherein the low-battery state can be detected precisely and the time of battery-powered operation is increased.

According to a first aspect of the invention, there is provided a low-battery state detecting method comprising the steps of: a) reading the value of electric current output from a battery; b) finding a low-battery detection reference voltage from the value of the current read in step (a); c) reading the value of the voltage of the battery; d) computing a voltage difference between a currently read battery voltage and the previously read battery voltage; e) correcting the low-battery detection reference voltage in accordance with the computed voltage difference; and f) comparing the corrected low-battery detection reference voltage with the read voltage obtained in step (c), and determining the low-battery state to be when the read voltage obtained in step (c) is lower than the corrected low-battery detection reference voltage.

According to a second aspect of the invention, there is provided a low-battery state detecting system comprising: means for measuring a discharge current of a battery; means for obtaining a low-battery detection reference voltage from the measured current; means for measuring the voltage of the battery; means for computing a voltage difference between the measured voltage and the previously measured voltage; means for correcting the low-battery detection reference voltage in accordance with the computed voltage difference; means for comparing the corrected low-battery detection reference voltage with the measured battery voltage; and means for determining the low-battery state to be when, as the result of the comparison, the measured battery voltage is lower than the corrected low-battery detection reference voltage.

According to the present invention, the low-battery state can be detected precisely by means of a program capable of determining the low-battery state on the basis of the combination of three elements, i.e. battery voltage, current output from the battery, and battery voltage variation. By virtue of these three elements for determining the low-battery state, the low-battery state can be detected precisely, and the time of battery-powered operation can be increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENT

Figures 3, 5:
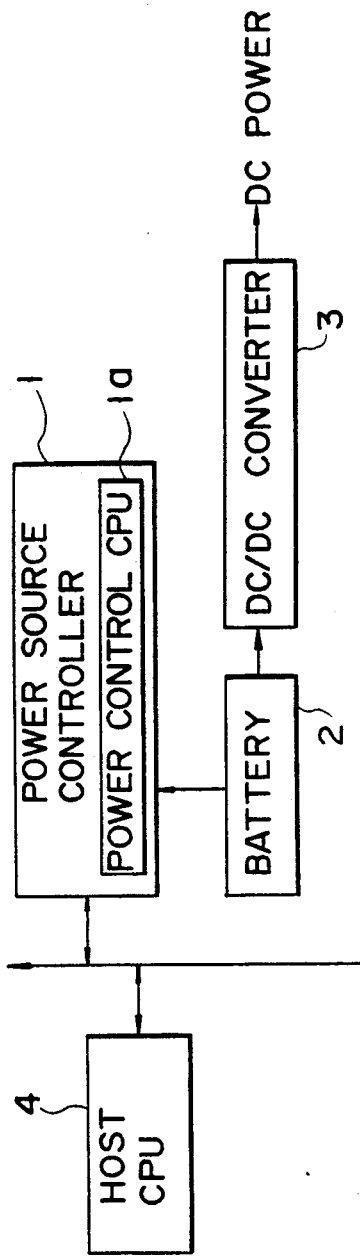
FIG. 3 is a block diagram showing a low-battery state detection system according to an embodiment of the present invention.
FIG. 5 is a table for storing correspondence between the voltage variations and the reference voltage correction values for detecting the low-battery state.

FIG. 3 is a block diagram showing an embodiment of the present invention. A power source controller 1 is connected to a host CPU 4 through a system bus 5. The low-battery state of the battery 2 is detected on the basis of the voltage, output current, and voltage variation of the battery. The low-battery state is signaled to the host CPU 4. The power source controller 1 includes a power control CPU 1a. The battery 2 is connected to the power source controller 1 and to a DC/DC converter 3, and the battery 2 supplies DC power to the controller 1 and converter 3. The DC/DC converter 3 receives the DC power from the battery 2 and generates a constant DC power necessary for operating the personal computer. The host CPU 4 functions to inform a user of the low-battery condition, which has been supplied from the power source controller 1.

Figure 4:
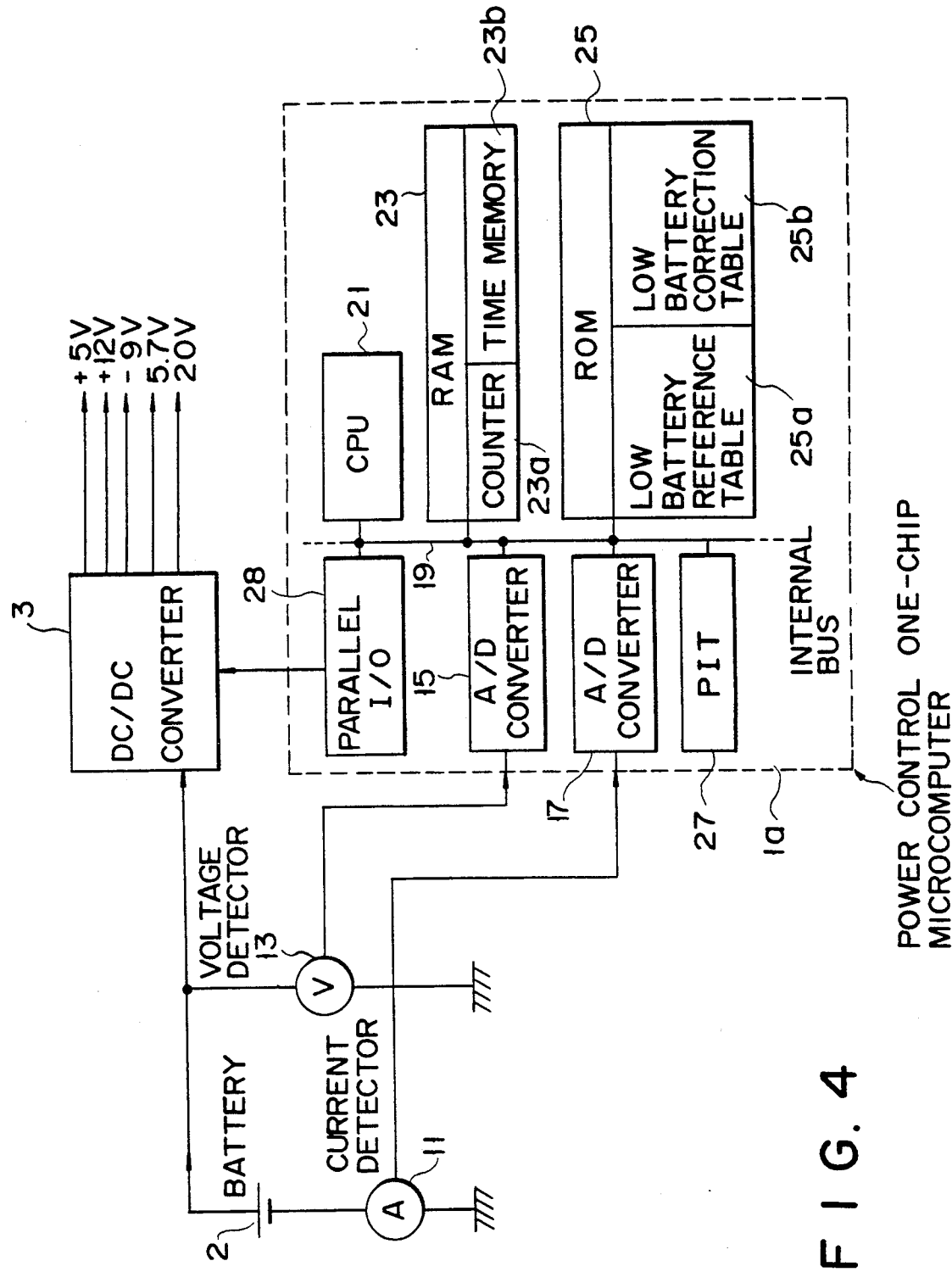
FIG. 4 is a detailed block diagram of a power source controller shown in FIG. 3.

FIG. 4 is a block diagram showing in detail the power source controller shown in FIG. 3. A current detector 11 is connected in series with a battery 2, and a voltage detector 13 is connected in parallel with the battery 2. The output (analog value) from the voltage detector 13 is supplied to a first A/D converter 15, and the output (analog value) from the current detector 11 is supplied to a second A/D converter 17, and these outputs (analog values) are converted to digital values. The outputs from the first A/D converter 15 and from the second A/D converter 17 are supplied to a CPU 21 through a system bus 19. The system bus 19 is connected to a RAM 23, a ROM 25, a parallel I/O interface 28, and a programmable interrupt timer (PIT) 27. The CPU 21, RAM 23, ROM 25, first A/D converter 15, second A/D converter 17, parallel I/O interface 27, and PIT 27 are included, for example, in a one-chip microcomputer.

The RAM 23 includes a software counter 23a for counting time in units of one second each time an interrupt from the PIT 27 is effected, and a time memory 23b for storing a time taken for the battery voltage to decrease by 59 mV. The default value of the software counter 23a is 0, and the default value of the time memory 23b is 32. The ROM 25 stores a table 25a for detecting a low-battery reference voltage, and a table 25b for correcting the low-battery reference voltage. The low-battery detection table 25a shows correspondence between input current values and low-battery reference voltage values. The CPU 21 receives the digital value analog output of current detector 11 having been converted by the A/D converter 17. Referring to the conversion table, the CPU 21 then finds a low-battery reference voltage corresponding to the detected current value.

The low-battery correction table 25b stores correction values, computed in advance by taking into consideration the differences in charge time and the resolution of the first and second A/D converters 15 and 17. In this embodiment, the battery voltage is read every second to compute a difference between the presently read battery voltage and the previously read battery voltage, and it is determined whether or not the presently read battery voltage has decreased by 59 mV, compared to the previously read one. The time taken for the battery voltage to decrease by 59 mV is computed, and the low-battery correction table is referred to, using the time for a 59 mV decrease in battery voltage as a parameter. In the low-battery correction table shown in FIG. 5, the time taken for the battery voltage to decrease by 59 mV is used as a parameter. The reason for this is that the resolution of the employed A/D converter is 59 mV per digital value "1". The gradient of the battery voltage characteristic curve can be computed from the time measured for the battery voltage to decrease by 59 mV. The computed gradient is collated with the values shown on the battery voltage characteristic graph of FIG. 2, and the charge time can then be estimated. Thus, the correction values of the reference voltage are calculated in advance from the battery voltage characteristic curve corresponding to the charge time, and are stored in the ROM 25.

The CPU 21 reads the voltage value from the voltage detector 13 in every sampling time period (in this embodiment, one second). The voltage value is then converted to a digital value by the first A/D converter 15, and the digital value is stored in the RAM 23. Then, the CPU 21 subtracts the presently read battery voltage from the previously read battery voltage, and obtains the difference.

Further, the PIT 27 is programmed such that the CPU 21 is supplied with an interrupt signal at every second. In response to the interrupt signal from the PIT 27, the CPU 21 executes the operation illustrated in the flowchart of FIG. 6. In this case, the CPU 21 adds one second to the software counter provided in the RAM 23, each time the CPU receives the interrupt signal.

FIG. 5 is a table for storing corresponding values between the voltage variations and the reference voltage correction values for detecting the low-battery state.

As is shown in FIG. 5, low-battery reference voltage correction values are stored so as to correspond to the time for power supply voltage being decreased by 59 mV. For example, when the time is 4 seconds or less, +177 mV is added to the low-battery reference voltage. When the time is 4 to 8 seconds, +177 mV is added. When the time is 8 to 12 seconds, +118 mV is added. When the time is 33 seconds or more, +0 V is added.

Figure 6A:
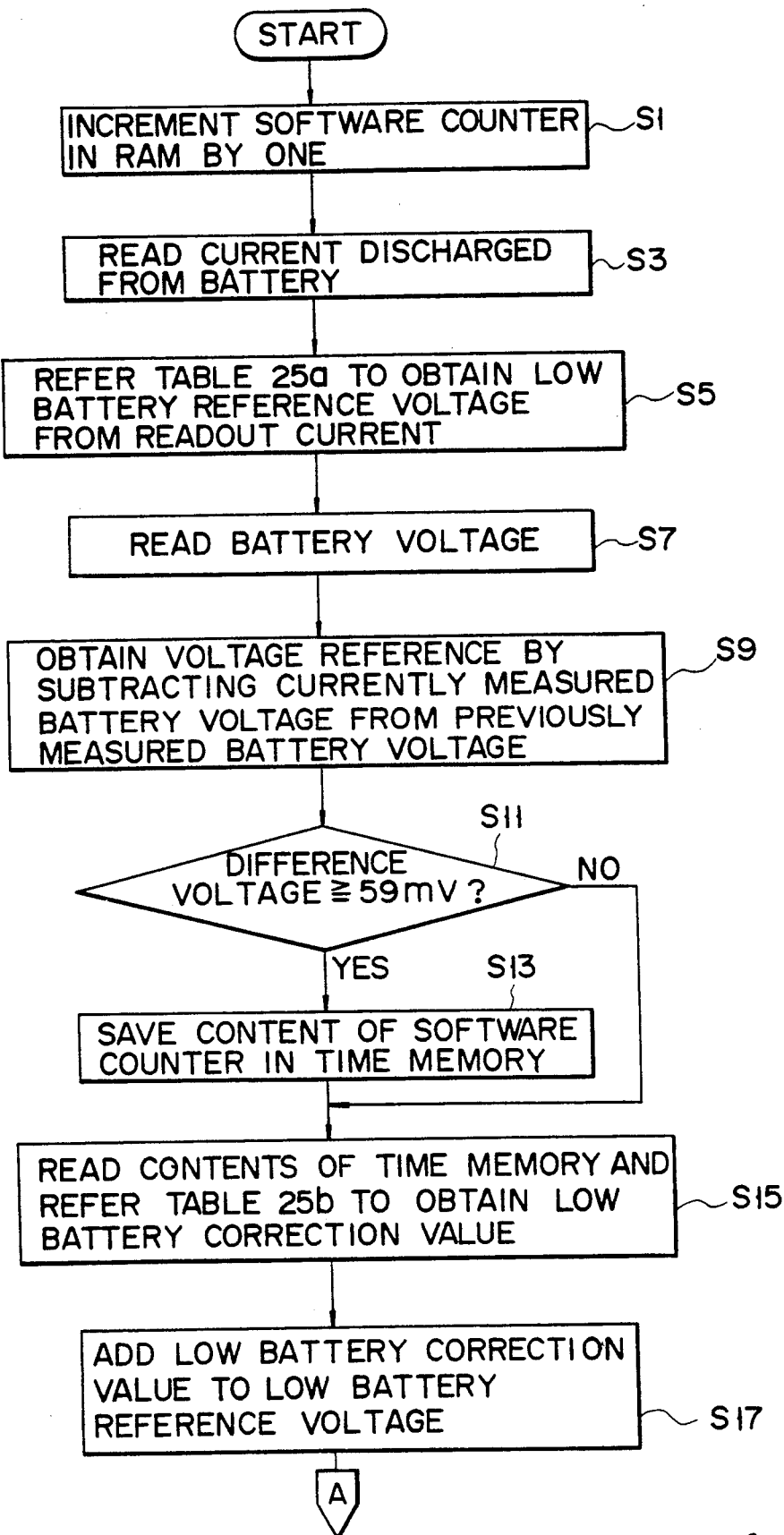
FIGS. 6A and 6B are flowcharts for illustrating an operation for detecting the low-battery state.
Figure 6B:
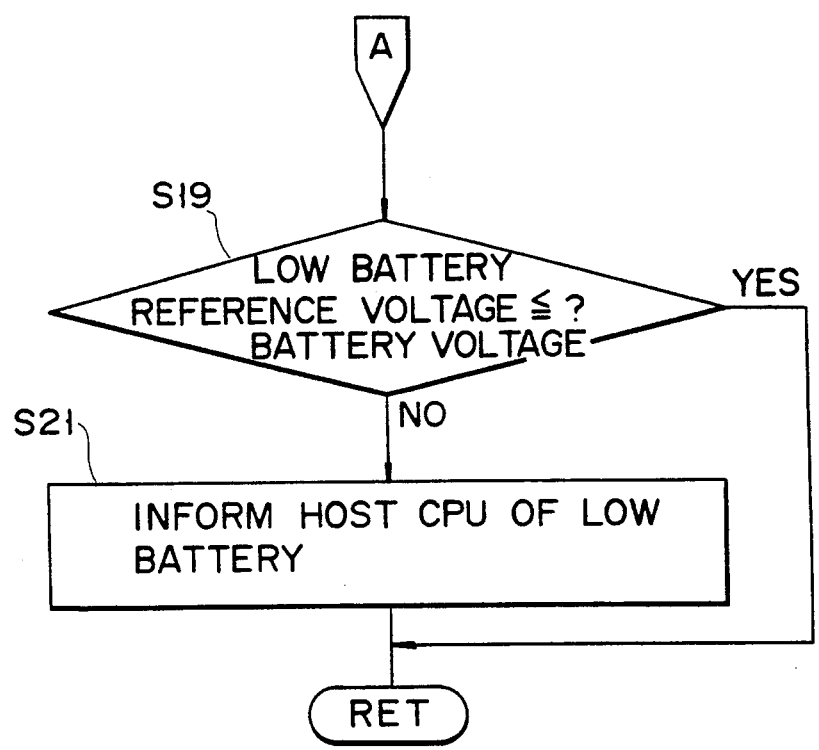

The operation of the above-described first embodiment will now be described with reference to flowcharts of FIGS. 6A to 6B.

The initial value of the software counter 23a is "0". In step S1, CPU 21 increments the contents of the software counter 23a in the RAM 23 by one. In step S3, the current value from the current detector 11, that is, the value of discharged current from the battery 2, is read through the second A/D converter 17. In step S5, the CPU 21 refers to the reference voltage conversion table 25a for detection of the low-battery state, and obtains the reference voltage value for low-battery detection from the detected current value.

In subsequent step S7, the voltage of the battery 2 from the voltage detector 13 is read through the first A/D converter 15. In step S9, a difference voltage is obtained by subtracting the currently measured battery voltage from the previously measured battery voltage. In step S11, it is determined whether or not the difference voltage is 59 mV or more. If the difference voltage is less than 59 mV, the control routine goes to step S15. In this case, the low-battery reference voltage correction table 25b is referred to, on the basis of the time data set previously in the time memory 23b when the voltage decreased by 59 mV or more. On the other hand, when it is determined that the difference voltage is 59 mV or more, the contents of the software counter 23a in the RAM 23 are stored in the time memory 23b in step S13.

In step S15, the content of the time memory 23b, i.e. the time taken for the battery voltage to decrease by 59 mV or more, is read out. The low-battery reference voltage correction table 25b in the ROM 25 is referred to, on the basis of the read-out value and the corresponding correction voltage value corresponding to the time is obtained. In step S17, the low-battery correction value is added to the low-battery reference voltage. In step S19, the corrected low-battery reference voltage value is compared with the measured battery voltage. When the battery voltage is lower than the low-battery reference voltage value, the CPU 21 informs the host CPU 4 of the low-battery state in step S21. On the other hand, if the determination step S19 is affirmative, the CPU 21 skips step S21, and returns to a main routine. In response, the host CPU 4 turns on a low-battery indication LED lamp, or generates an alarm to the operator by means of a buzzer.

Figure 1:
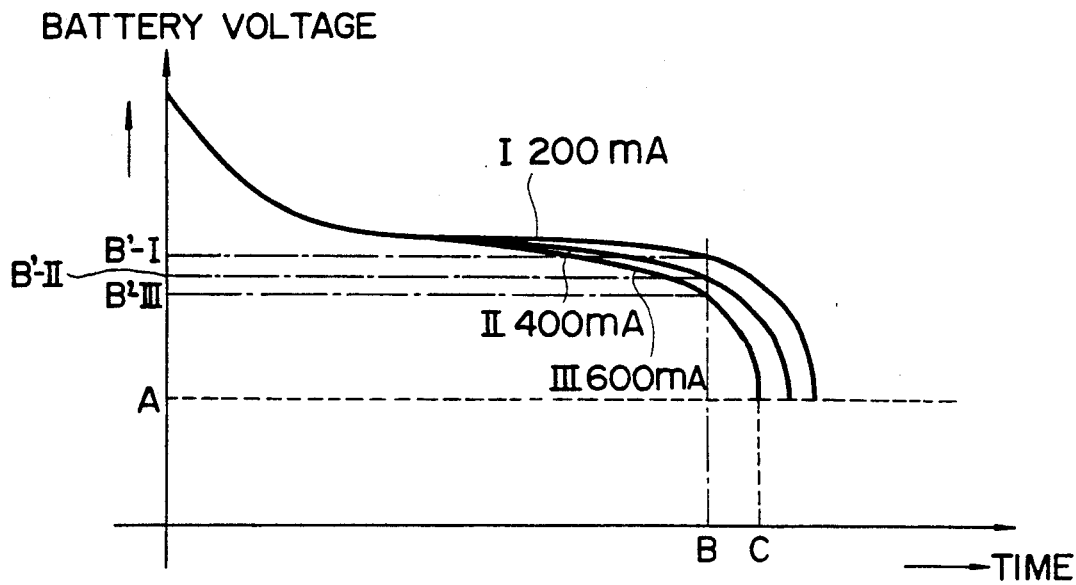
FIG. 1 is a graph showing conventional battery voltage characteristic curves, when the electric currents output from a battery have the values of 200 mA, 400 mA, and 600 mA.
Figure 2:
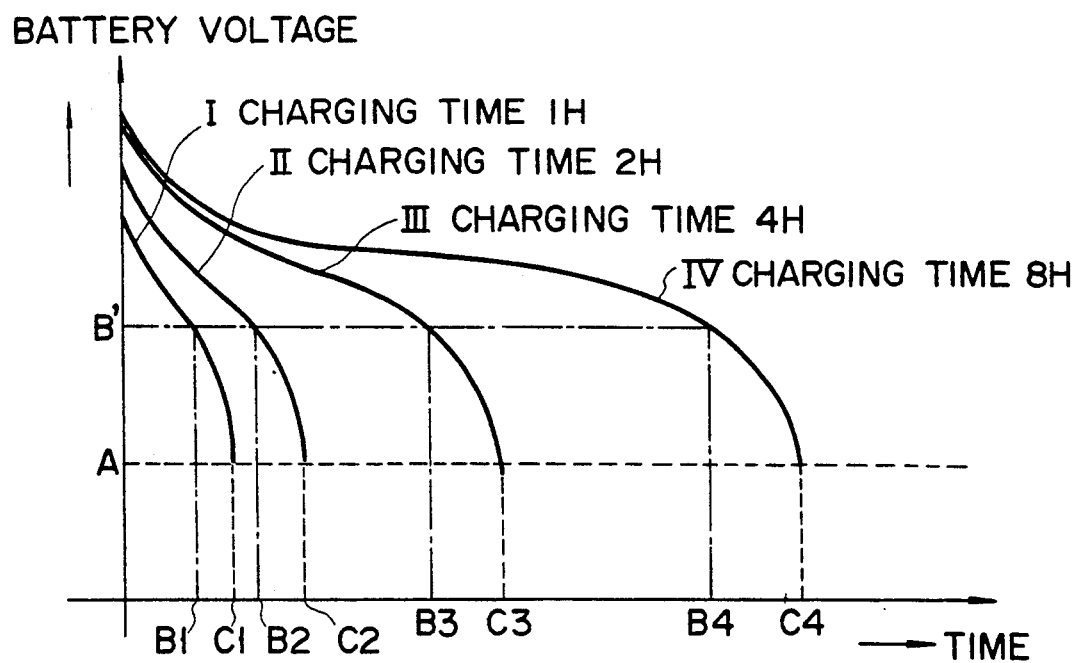
FIG. 2 is a graph showing conventional battery voltage characteristic curves, when the battery is charged for 1 hour, 2 hours, 4 hours, and 8 hours.

As described above, according to the present invention, the time difference between Cn and Bn (n=1, 2, 3, 4) in FIG. 2 is equalized, irrespective of the charge time of the battery. Thus, the time period from the time when the low-battery state was determined to the time when the personal computer fails to operate normally is made constant, irrespective of the charge time.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A low-battery detection warning method comprising the steps of:
    a) generating a discharge current signal related to a discharge current value outputted from a battery;
    b) generating a low-battery detection reference voltage from the discharge current signal;
    c) generating a first and a second voltage signal related to a first and a second voltage value of the battery determined at sequential times;
    d) employing electronic processing means to determine a difference between the first and second voltage signals;
    e) employing said electronic processing means to modify the low-battery detection reference voltage in accordance with the determined difference and battery voltage characteristic curves corresponding to different charge time periods, so as to make constant a time period from the time a low-battery stage was determined to the time when a device driven by the battery fails to operate normally, irrespective of a charge time for the battery;
    f) employing said electronic processing means to compare the modified low-battery detection reference voltage with the first voltage signal, and determining the low-battery state when the first voltage signal is lower than the modified low-battery detection reference voltage; and
    g) generating a detection warning signal when the low-battery state has been determined to exist.

2. The method according to claim 1, wherein the step (b) includes a step of generating the low-battery detection reference voltage, on the basis of the battery voltage characteristic curves which correspond to different current values.

3. A low-battery detection warning system comprising:
    current detector means for measuring a discharge current from a battery;
    voltage detector means for measuring a voltage value from the battery;
    first table memory means for containing low-battery detection reference voltages which correspond to measured battery discharged current values;
    second table memory means for containing low-battery detection reference correction values which correspond to variations in measured battery voltage values; and
    electronic processing means for: 1) obtaining a low-battery detection reference voltage in accordance with the discharge current measured by the current detector means from the first table means, 2) obtaining a low-battery detection reference correction value in accordance with variations in voltage values measured by the voltage detector means from the second table means, 3) correcting the low-battery detection reference voltage from the first table means with low-battery detection voltage correction values from the second table means and battery voltage characteristic curves, thus making constant time periods measuring from the time when a low-battery state is determined to the time when a device driven by the battery ceases normal operation, irrespective of the battery charge time, and 4) determining the low-battery state on the basis of the corrected low-battery detection reference voltage and generating a low-battery detection warning signal based upon the determination of the low-battery state.

4. The system according to claim 3, wherein the electronic processing means corrects the low-battery detection reference voltage on the basis of the battery voltage characteristic curves which correspond to different current values.

5. A low-battery detection warning system comprising:
- current detector means for measuring a discharge current from a battery;
- voltage detector means for measuring a first voltage value and a second voltage value from the battery at sequential times; and
- central processing means for: 1) determining a corresponding low-battery detection reference voltage in accordance with a discharge current value from the current detector means, 2) determining a voltage difference between the first and second measured voltages, 3) correcting the low-battery detection reference voltage in accordance with the voltage difference and battery voltage characteristic curves, which correspond to different battery charge times, so as to make constant time periods measuring from the time when a low-battery state is determined to the time when a device driven by the battery ceases normal operation, irrespective of the battery charge time, and 4) comparing the corrected low-battery detection reference voltage and the measured battery voltage for determining that a low-battery state exists when the first measured battery voltage is lower than the corrected low-battery detection reference voltage, and generating a low-battery detection warning signal based upon the determination of the low-battery state.

6. The system according to claim 5, wherein the central processing means corrects the low-battery detection reference voltage on the basis of the battery voltage characteristic curves corresponding to different current values.

7. An electronic equipment operable by a rechargeable battery, comprising:
- current detector means for measuring a discharge current value from the battery;
- voltage detector means for measuring a voltage value from the battery;
- first determining means for determining a reference voltage for detecting a low battery state in accordance with the discharge current value measured by the current detector means;
- memory means for storing correction values for correcting the low-battery-detection reference voltage determined by the first determining means, the correction values being used for making constant time periods measured from the time when the low battery state is detected to the time when the electronic equipment ceases normal operation, the correction values corresponding to respective charging times of the battery;
- second determining means for determining the charging time of the battery based on the time required for the battery voltage being reduced to a predetermined voltage value;
- correcting means for correcting the low-battery-detection reference voltage determined by the first determining means with one of the correction values stored in the memory means, the one correction value being determined by the second determining means based on the charging time of the battery;
- detecting means for detecting the battery voltage being less than the low-battery-detection reference voltage corrected by the correcting means; and
- means for generating a warning signal in accordance with a result of the detecting means.

8. A portable electronic equipment operable by a battery, comprising:
- current detector means for measuring a discharge current value from the battery;
- voltage detector means for measuring a voltage value from the battery;
- determining means for determining a reference voltage for detecting a low battery state in accordance with the discharge current value measured by the current detector means;
- memory means for storing correction values for correcting the low-battery-detection reference voltage determined by the determining means, the correction values being used for making constant time periods measured from the time when the low battery state is detected to the time when the electronic equipment ceases normal operation, the correction values corresponding to respective charging times of the battery;
- correcting means for correcting the low-battery-detection reference voltage determined by the determining means with one of the correction values stored in the memory means, the one correction value being based on the time required for the battery voltage being reduced to a predetermined voltage value;
- detection means for detecting the battery voltage being less than the low-battery-detection reference voltage corrected by the correcting means; and
- means for generating a warning signal in accordance with a result of the detection means.

* * * * *